United States Patent [19]

Hinooka

[11] Patent Number: 5,173,616

[45] Date of Patent: Dec. 22, 1992

[54] CODE SETTING CIRCUIT

[75] Inventor: Kiyonobu Hinooka, Tokyo, Japan

[73] Assignee: NEC Corporation, Tokyo, Japan

[21] Appl. No.: 775,462

[22] Filed: Oct. 15, 1991

[30] Foreign Application Priority Data

Oct. 12, 1990 [JP] Japan .................................. 2-274790

[51] Int. Cl.[5] .......................... H02H 7/20; H03K 17/18
[52] U.S. Cl. .................................. 307/202.1; 307/303;
307/446
[58] Field of Search ...................... 307/202.1, 443, 303,
307/446, 465

[56] References Cited

U.S. PATENT DOCUMENTS

| 4,223,277 | 9/1980 | Taylor et al. | 307/202.1 |
| 4,546,455 | 10/1985 | Iwahashi et al. | 307/202.1 |
| 4,608,530 | 8/1986 | Bacrania | 307/202.1 |
| 4,716,302 | 12/1987 | Flannagan et al. | 307/202.1 |

Primary Examiner—Edward P. Westin
Assistant Examiner—Richard Roseen
Attorney, Agent, or Firm—Sughrue, Mion, Zinn, Macpeak & Seas

[57] ABSTRACT

A code setting circuit for outputting a plurality of bits of code setting signal to a code generation circuit, includes a plurality of unitary circuits each generating one bit of the code setting signal. Each of the unitary circuits includes a first P-channel transistor having a source connected at to a high voltage supply line and a gate connected to commonly receive a power-on signal, and an N-channel effect transistor having a drain connected to a drain of of the first P-channel transistor and a source to a fusing-off pulse application pad. A second P-channel transistor is connected in parallel to the P-channel effect transistor and a gate connected to an output of a first inverter having an input connected to the drain of the first P-channel transistor. A thin film resistor is connected between the fusing-off pulse application pad and a ground line. A second inverter is connected at its input to the drain of the first P-channel transistor and has an output supplying a binary signal to the input of the code generation circuit.

7 Claims, 5 Drawing Sheets

CODE SETTING CIRCUIT

Background of the Invention

1. Field of the Invention

The present invention relates to a code setting circuit, and more specifically to a code setting circuit having a thin film fuse for trimming.

2. Description of Related Art

Recently, demands for high precision and low power consumption of a circuit condition setting are increasing more and more with increasing performance and increasing integration density of integrated circuits.

In particular, in integrated circuits, since a catalog standard for a reference voltage and a circuit current in analog circuits and likes is very strict, an additional circuit is required which can adjust the reference voltage or the circuit current within a tolerance range of the required standard by a trimming performed in the process of manufacturing the integrated circuit. This trimming has a property of permanently maintaining the adjusted value unchangeably, so that the reference voltage or the circuit current is fixed if the trimming is conducted one time in the manufacturing process, and therefore, re-adjustment is no longer possible in actual application of the integrated circuit. Therefore, the additional circuit is required to be highly reliable so as to operate without error.

One type of this additional circuit is a code setting circuit. Referring to FIG. 1, there is shown one typical example of conventional code setting circuits. The shown circuit includes a constant current circuit composed of a MOS transistor M19 and a constant current source Io connected in series between a high voltage $V_{DD}$ and the ground so as to allow a constant current $I_{M10}$ to flow through the MOS transistor M19. The shown circuit also includes three transistors M20, M21 and M22 connected to flow the constant current $I_{M10}$ determined by the constant current circuit, and three thin film resistors R7, R8 and R9 connected in series to the transistors M20, M21 and M22, respectively. Each of the transistors M20, M21 and M22 and a corresponding one of the resistors R7, R8 and R9 form a ratio circuit. Here, a resistance of the resistors R7, R8 and R9 is set to be sufficiently lower than an ON resistance of the transistors M20, M21 and M22. Therefore, in the shown condition, all of three nodes A, B and C are at a low level, and three inverters $I_{13}$ to $I_{15}$ having an input connected to the nodes A, B and C, respectively, output a high level signal to a decoder 300, respectively.

For a code setting, the thin film resistors R7, R8 and R9 are selectively fused or broken off by applying a high voltage to only a selected one (or ones) of pads 30, 32 and 34 associated to the thin film resistors R7, R8 and R9, respectively, so that a large current is caused to flow through a selected thin film resistor and an intense heat is generated in the selected thin film resistor. Here, assume that only the thin film resistor R8 is fused or broken off. In this case, the broken thin film resistor R8 ideally have an infinite resistance, and therefore, the node B is brought into a high level by action of the transistor M21. As a result, only the inverter $I_{14}$ outputs a low level signal to the decoder 300.

As seen from above, by selectively breaking off the thin film resistors R7 to R9, a desired binary code of three bits can be supplied to the decoder 300.

However, if the breaking-off is incomplete and a leakage current occurs at a broken-off portion due to a change with the passage of time, and if the leakage current exceeds the constant current flowed through the transistor M21, the potential of the node B changes from the high level to the low level. Namely, a malfunction occurs.

In the circuit shown in FIG. 1, in addition, an electric current ceaselessly flows through the thin film resistors R7 to R9 if these resistors are not broken off. Therefore, in order to realize a low power consumption, it is necessary to limit the constant current $I_{M10}$ on the order of 10 μA. However, this means that if the leakage current exceeds 10 μA, the malfunction occurs.

In order to overcome the above mentioned problem, the inventor of the present application proposed a circuit as shown in FIG. 2 in Japanese Patent Application No. Showa 63-109666, which was laid open as Japanese Patent Application Laid-open No Heisei 1-278746 on Nov. 9, 1989. This circuit includes P-channel MOS transistors M24, M26 and M28 which are turned on only for a short period of time just after a power-on, in response to a power-on signal Sp which is brought to a low level only for the short period of time only when a power is turned on. These transistors M24, M26 and M28 respectively cooperate with associated thin film resistors R10, R11, and R12 so as to form a ratio circuit only during the short period of time just after the power-on. In ordinary cases, the thin film resistors R10 to R12 are set to be on the order of 100 Ω. Therefore, if the transistors M24, M26 and M28 are set to have an ON resistance of not less than 1 KΩ, nodes D, E and F become a low level when the thin film resistors R10 to R12 are not broken off. In this case, accordingly, associated inverters $I_{16}$ to $I_{18}$ output a high level signal to a decoder 300.

Assuming that the thin film resistor R11 is broken off, a node E is brought to a high level by action of the transistor M26, similarly to the situation explained hereinbefore in connection with the example shown in FIG. 1, and therefore, the inverter $I_{17}$ outputs a low level signal to the decoder.

As mentioned above, the transistors M24, M26 and M28 are turned on only for the short period of time just after the power-on, but since P-channel MOS transistors M23, M25 and M27 having a gate controlled by an inverted signal of the nodes D, E and F are provided in parallel to the transistors M24, M26 and M28, respectively, respective once-determined levels of the nodes nodes D, E and F are stably maintained.

In the circuit shown in FIG. 2, if the thin film resistors R10 to R12 are not broken off, both of a pair of transistors connected between a high voltage $V_{DD}$ and each of the thin film resistors are off in a steady condition. Therefore, no current flows through the resistor. On the other hand, when the thin film resistor R11 is broken off, the transistor M25 is turned on and maintained in the ON condition. If the ON resistance of the transistor M25 is set to be on the order of 1 KΩ, even if the broken-off thin film resistor R11 flowed a current of a milliampere order, no malfunction occurs. Therefore, the tolerance of the leakage current is increased to one hundred times or more of that of the conventional constant current type shown in FIG. 1.

As seen from the above, the circuit shown in FIG. 2 can realize a greatly stable code setting circuit. However, the circuit shown in FIG. 2 is disadvantageous in the following point:

As seen from FIG. 2, each of pads 40, 42 and 44 connected to the thin film resistors is connected through the two parallel-connected P-channel transistors to the high voltage $V_{DD}$. Each of the P-channel transistors is formed in an n-well of a substrate, as shown in FIG. 3. In FIG. 3, the substrate generally designated by Reference Numeral 10 is of a p-type, and has the n-well 12, in which an n+ region 14 is formed for biasing the n-well 12. In addition, a p+ drain region 16 and a p+ source region 18 of the P-channel transistor are formed in the n-well 12, and a gate 20 is located above a channel region between the p+ drain region 16 and the p+ source region 18.

In the above mentioned structure, the drain region 16 is connected directly to a pad 22 connected to the thin film resistor, and the source region 18 and the n+ region 14 are connected to a high voltage supply line $V_{DD}$, which has a parasitic capacitance C.

Here, assume that a high voltage is applied to a desired pad so as to break off the associated thin film resistor, while maintaining the high voltage supply line $V_{DD}$ in a floating condition. As mentioned above, since the pad is connected to the drain of the P-channel transistor, the pad is connected to the high voltage supply line $V_{DD}$ through a PN junction diode which is formed between the drain region 16 and n-well 12 and which is biased in a forward direction by the high voltage applied to the pad. Since an ON resistance of the ON junction diode is on the order of a few tens ohms, a substantial amount of charging current flows through the PN junction diode into the high voltage supply line $V_{DD}$ so as to charge the parasitic capacitance C of the high voltage supply line $V_{DD}$. As a result, a rising speed of a pulse applied for fusing or breaking off the thin film resistor is substantially delayed. In general, it is known that the faster the rising speed of the breaking-off pulse is, the better the broken-off condition of the thin film resistor becomes.

Therefore, the circuit shown in FIG. 2 has encountered a problem in which the thin film resistor cannot be sufficiently fused or broken off since a rising speed of a fusing-off pulse is lowered due to the parasitic capacitance of the voltage supply line $V_{DD}$.

Summary of the Invention

Accordingly, it is an object of the present invention to provide a code setting circuit which has overcome the above mentioned defect of the conventional one.

Another object of the present invention is to provide a code setting circuit capable of increasing a rising speed of a fusing-off pulse applied to a pad connected to a thin film resistor so that a broken-off condition of the thin film resistor can be improved, and also capable of suppressing an increase of a leakage current with the passage of time, whereby reliability of the code setting circuit can be remarkably improved.

The above and other objects of the present invention are achieved in accordance with the present invention by a code setting circuit for setting an input of a code generation circuit, the code setting circuit including a first field effect transistor of a first conduction type having a main current path connected at its one end to a first voltage supply line and a gate connected to receive a power-on signal, a second field effect transistor of a second conduction type opposite to the first conduction type, the second field effect transistor having a main current path connected at its one end to the other end of the main current path of the first field effect transistor and at its other end to a fusing-off pulse application pad, a third field effect transistor having a main current path connected in parallel to the main current path of the first field effect transistor and a gate connected to an output of a first inverter having an input connected to the other end of the main current path of the first field effect transistor, a thin film resistor connected between the fusing-off pulse application pad and a second voltage supply line, and a second inverter having an input connected to the other end of the main current path of the first field effect transistor and an output supplying a binary signal to the input of the code generation circuit.

With the above mentioned arrangement, the second transistor functions to isolate the fusing-off pulse application pad from a PN junction diode which is formed within the first transistor and which is biased in a forward direction. Therefore, when a high voltage pulse is applied to the fusing-off pulse application pad so as to break off the associated thin film resistor, an electric current does not flow through the PN junction diode formed within the first transistor, into the first voltage supply line having a parasitic capacitance, since the electric current is blocked by the second transistor. Accordingly, the fusing-off pulse having an abrupt rising edge is applied to the thin film resistor, and therefore, the thin film resistor can be completely broken or cut off.

The above and other objects, features and advantages of the present invention will be apparent from the following description of preferred embodiments of the invention with reference to the accompanying drawings.

DESCRIPTION OF THE PREFERRED EMBODIMENTS

Figure 1:
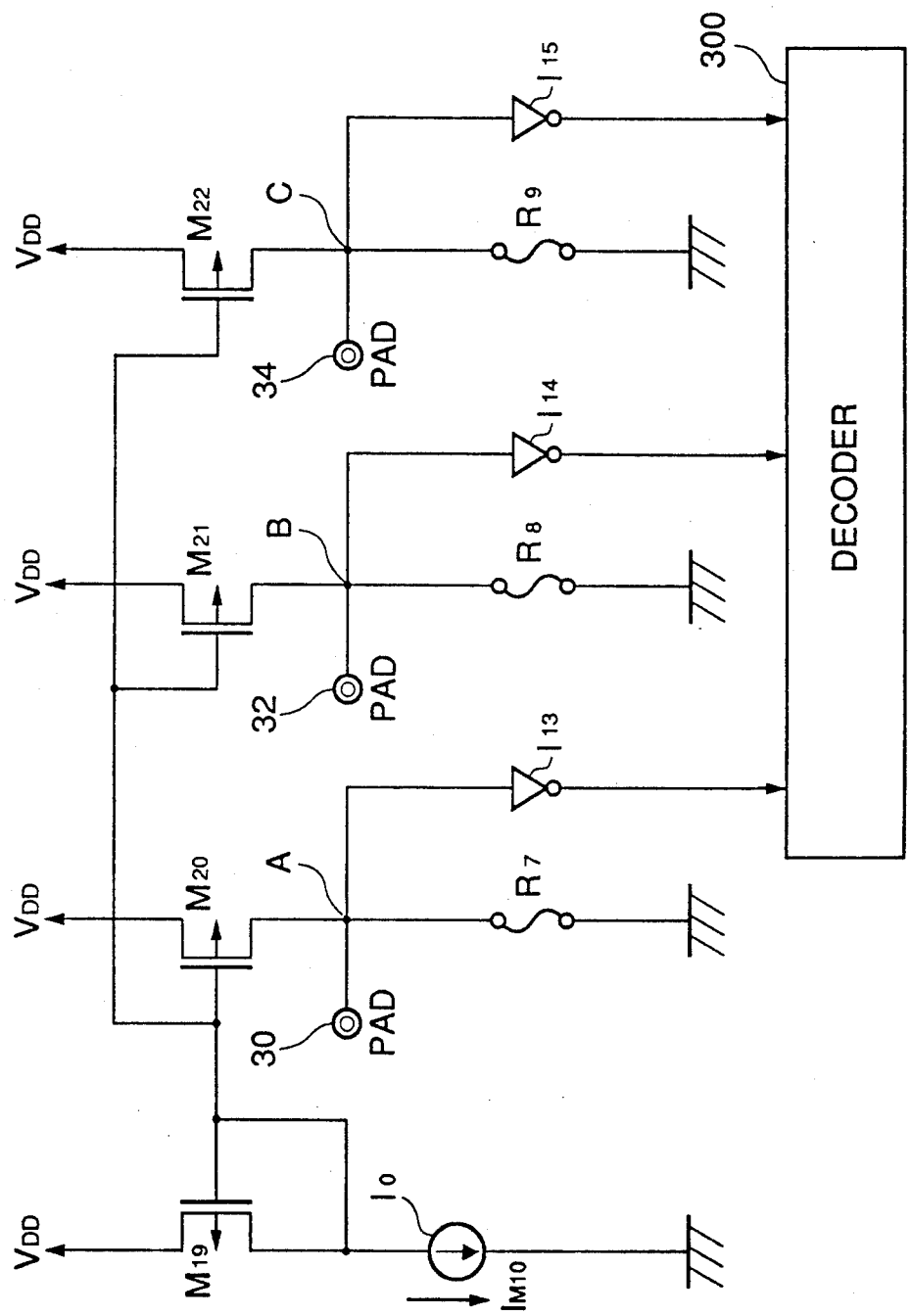
FIG. 1 is a circuit diagram of one example of the conventional code setting circuit.
Figure 2:
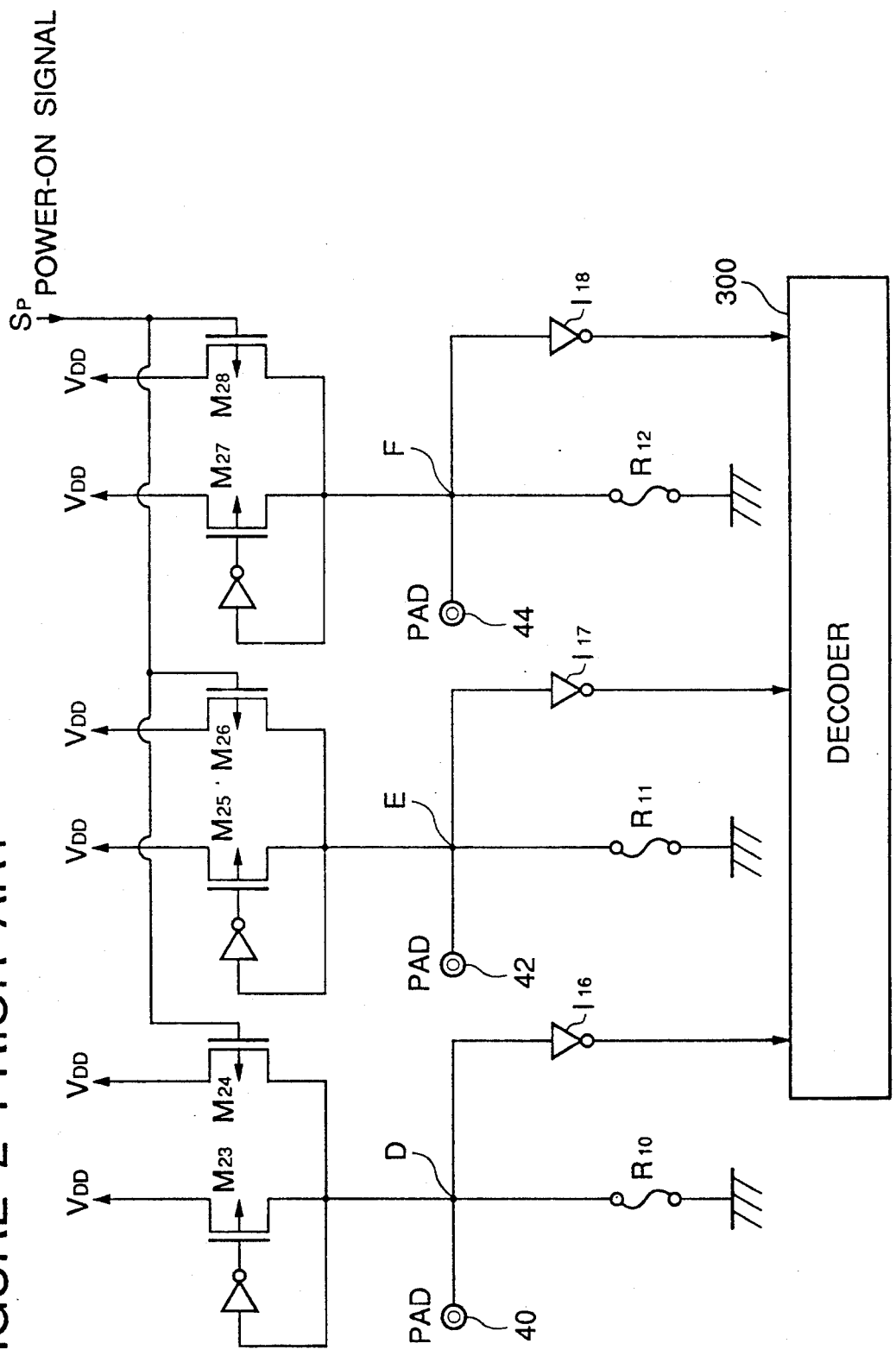
FIG. 2 is a circuit diagram of another example of the conventional code setting circuit.
Figure 3:
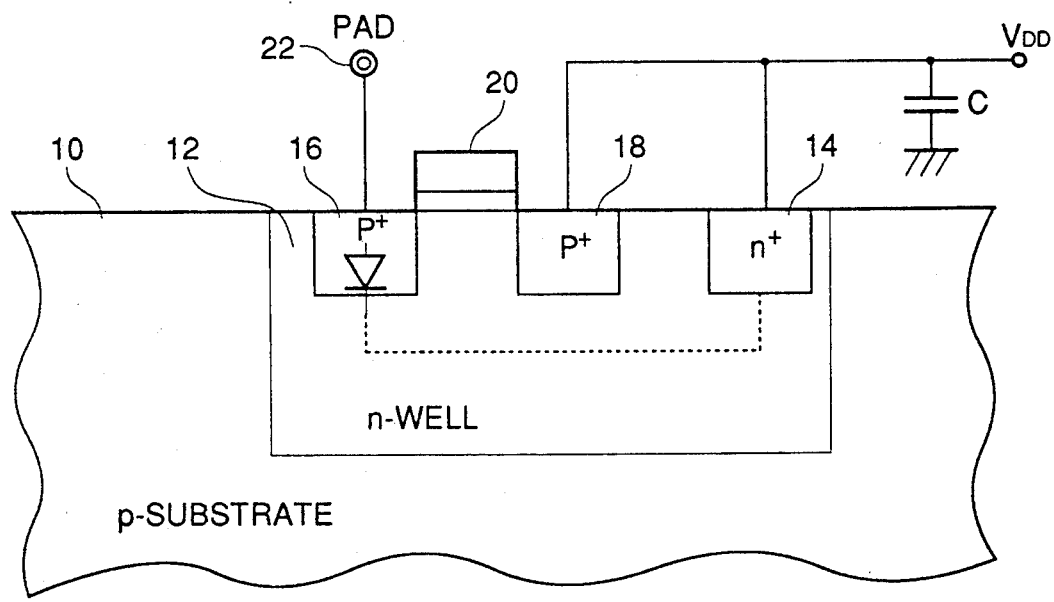
FIG. 3 is a diagrammatic sectional view of a P-channel transistor used in the conventional code setting circuit shown in FIG. 2.
Figure 4:
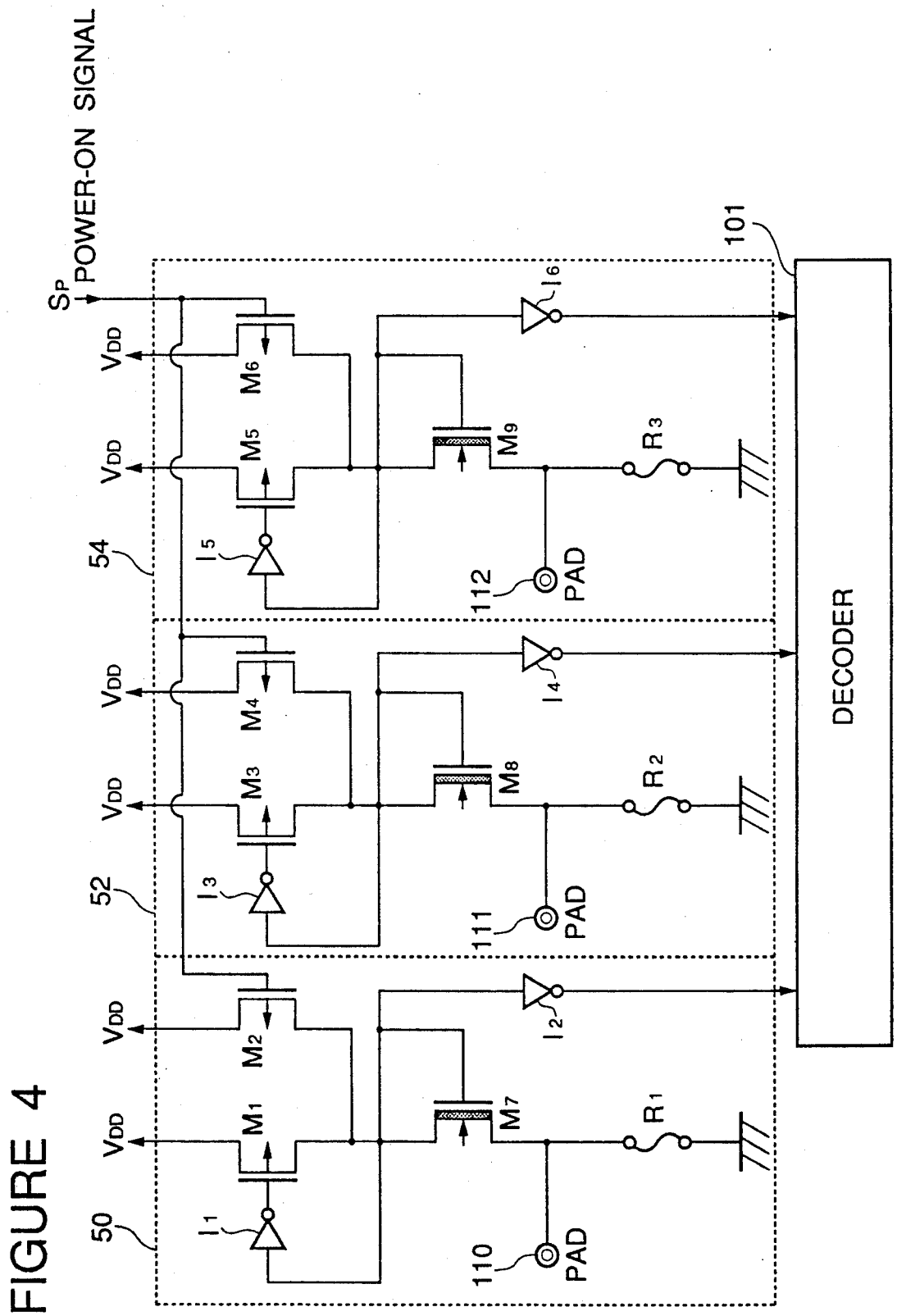
FIG. 4 is a circuit diagram of a first embodiment of the code setting circuit in accordance with the present invention.

Referring to FIG. 4, there is shown a circuit diagram of a first embodiment of the code setting circuit in accordance with the present invention.

The shown code setting circuit includes three unitary circuits 50, 52 and 54 each generating one bit of the code setting signal to a code generation circuit composed of a decoder 101. Each of the unitary circuits 50, 52 and 54 includes a P-channel enhancement transistor M2, M4 or M6 having a source connected to a high voltage supply line $V_{DD}$ and a gate connected to commonly receive a power-on signal Sp. Another P-channel enhancement transistor M1, M3 or M5 is connected in parallel to the P-channel enhancement transistor M2, M4 or M6, in such a manner that a source and a drain of the P-channel enhancement transistor M1, M3 or M5 is connected to the source and a drain of the P-channel enhancement transistor M2, M4 or M6, respectively. A gate of the P-channel enhancement transistor M1, M3 or M5 is connected to an output of an inverter $I_1$, $I_3$ or $I_5$ having an input connected to the drain of the P-channel enhancement transistor M2, M4 or M6.

In addition, an N-channel depletion transistors M7, M8 or M9 is connected at its drain and its gate to the drain of the P-channel enhancement transistor M2, M4 or M6. A source of the N-channel depletion transistors M7, M8 or M9 is connected to an associated thin film resistor R1, R2 or R3 and also to an associated pad 110, 111 or 112. In addition, the drain of the P-channel enhancement transistor M2, M4 or M6 is connected to an input of another inverter $I_2$, $I_4$ or $I_6$, which has an output supplying a binary signal to the input of the decoder 101.

In the above mentioned arrangement, when a voltage pulse for fusing off the thin film resistor is applied to a selected one of the pads 110, 111 and 112, since the only one transistor connected directly to each of the pads is the N-channel depletion transistor, the pad is in no way connected to the high voltage supply line $V_{DD}$ through a PN junction diode biased in a forward direction. In other words, a parasitic capacitance of the high voltage supply line $V_{DD}$ is connected to the pads 110 and 112 through only an ON resistance of the N-channel depletion transistors M7, M8 and M9, respectively, which is on the order of a few kilo-ohms. If the pads 110 to 112 are connected through a resistance of a few kilo-ohms to the parasitic capacitance of the high voltage supply line $V_{DD}$, since influence of the parasitic capacitance is negligible, the rising speed of the fusing-off pulse is not delayed.

Figure 5:
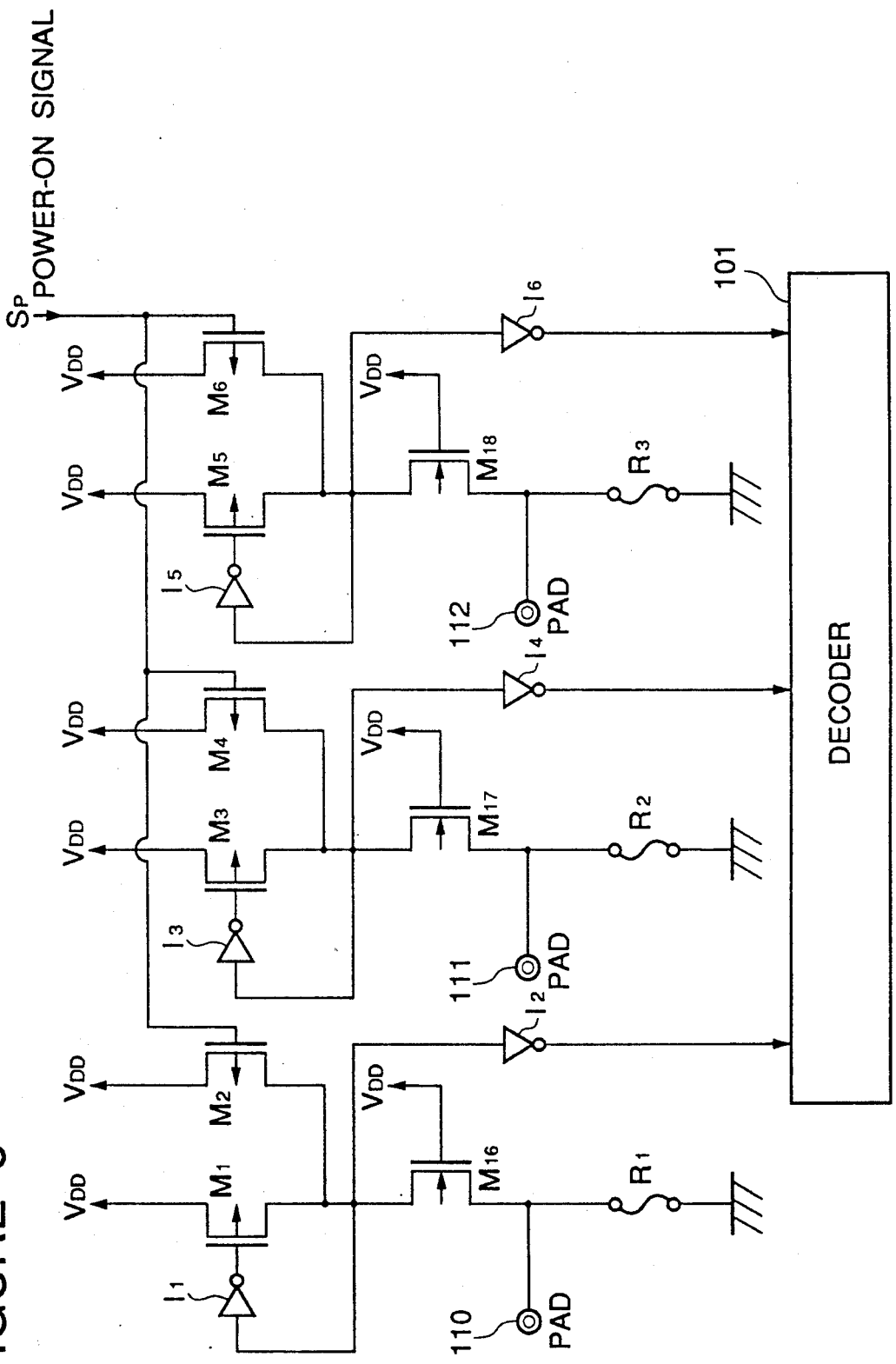
FIG. 5 is a circuit diagram of a second embodiment of the code setting circuit in accordance with the present invention.

Referring to FIG. 5, there is shown a second embodiment of the code setting circuit in accordance with the present invention. In FIG. 5, the same elements as those shown in FIG. 4 are given the same Reference Numerals, and explanation thereof will be omitted.

As seen form comparison between FIGS. 4 and 5, the second embodiment is characterized by comprising three N-channel enhancement transistors M16, M17 and M18, in place of the three N-channel depletion transistors M7, M8 and M9, respectively. A gate of each of the N-channel enhancement transistors M16, M17 and M18 is connected to the high voltage supply line $V_{DD}$.

In the second embodiment, when a voltage pulse for fusing off the thin film resistor is applied to a selected one of the pads 110, 111 and 112, the N-channel enhancement transistors M16, M17 or M18 connected to the selected pad 110, 111 or 112 is maintained in an OFF condition. Therefore, since the selected pad 110, 111 or 112 are isolated from the parasitic capacitance of the high voltage supply line $V_{DD}$, the fusing-off pulse is subjected to no influence of the parasitic capacitance, and therefore, the fusing-off pulse having a sharp rising edge is applied to the selected thin film resistor.

In addition, in the first embodiment, the high voltage $V_{DD}$ is applied to the broken-off thin film resistor without modification, but in the second embodiment, only a voltage of $(V_{DD} - V_T)$ is applied to the broken-off thin film resistor, where $V_T$ is a threshold of the N-channel enhancement transistor. Therefore, assuming $V_{DD} = 5$ V and $V_T = 2$ V, 5 V is applied to the broken-off thin film resistor in the first embodiment, but only 3 V is applied to the broken-off thin film resistor in the second embodiment. Therefore, the second embodiment is convenient in suppressing the increase of a leakage current in the broken-off resistor with the passage of time.

The invention has thus been shown and described with reference to the specific embodiments. However, it should be noted that the present invention is in no way limited to the details of the illustrated structures but changes and modifications may be made within the scope of the appended claims.

I claim:

1. A code setting circuit for setting an input of a code generation circuit, the code setting circuit including a first field effect transistor of a first conduction type having a main current path connected at its one end to a first voltage supply line and a gate connected to receive a power-on signal, a second field effect transistor of a second conduction type opposite to the first conduction type, the second field effect transistor having a main current path connected at its one end to the other end of the main current path of the first field effect transistor and at its other end to a fusing-off pulse application pad, a third field effect transistor having a main current path connected in parallel to the main current path of the first field effect transistor and a gate connected to an output of a first inverter having an input connected to the other end of the main current path of the first field effect transistor, a thin film resistor connected between the fusing-off pulse application pad and a second voltage supply line, and a second inverter having an input connected to the other end of the main current path of the first field effect transistor and an output supplying a binary signal to the input of the code generation circuit.

2. A code setting circuit claimed in claim 1 wherein the second field effect transistor is of a depletion type and has a gate connected to the other end of the main current path of the first field effect transistor.

3. A code setting circuit claimed in claim 1 wherein the second field effect transistor is of an enhancement type and has a gate connected to the first voltage supply line.

4. A code setting circuit claimed in claim 1 wherein the first voltage supply line is a high voltage supply line and the second voltage supply line is a ground line, and wherein the first and third field effect transistors are a P-channel type and the second field effect transistor is an N-channel type.

5. A code setting circuit claimed in claim 4 wherein the second field effect transistor is of a depletion type and has a gate connected to the other end of the main current path of the first field effect transistor.

6. A code setting circuit claimed in claim 4 wherein the second field effect transistor is of an enhancement type and has a gate connected to the high voltage supply line.

7. A code setting circuit for outputting a plurality of bits of code setting signal to a code generation circuit, the code setting circuit including a plurality of unitary circuits each generating one bit of the code setting signal, each of the unitary circuits including a first field effect transistor of a first conduction type having a main current path connected at its one end to a first voltage supply line and a gate connected to commonly receive a power on signal, a second field effect transistor of a second conduction type opposite to the first conduction type, the second field effect transistor having a main current path connected at its one end to the other end of the main current path of the first field effect transistor and at its other end to a fusing-off pulse application pad, a third field effect transistor having a main current path connected in parallel to the main current path of the first field effect transistor and a gate connected to an output of a first inverter having an input connected to the other end of the main current path of the first field effect transistor, a thin film resistor connected between the fusing-off pulse application pad and a second voltage supply line, and a second inverter having an input connected to the other end of the main current path of the first field effect transistor and an output supplying a binary signal to the input of the code generation circuit.

* * * * *